US011171132B2

(12) United States Patent
Mitra et al.

(10) Patent No.: US 11,171,132 B2
(45) Date of Patent: Nov. 9, 2021

(54) BI-DIRECTIONAL BREAKDOWN SILICON CONTROLLED RECTIFIERS

(71) Applicant: GLOBALFOUNDRIES U.S. INC., Santa Clara, CA (US)

(72) Inventors: Souvick Mitra, Essex Junction, VT (US); Alain F. Loiseau, Williston, VT (US); Robert J. Gauthier, Jr., Williston, VT (US); You Li, South Burlington, VT (US); Tsung-Che Tsai, Essex Junction, VT (US)

(73) Assignee: GLOBALFOUNDRIES U.S. INC., Santa Clara, CA (US)

( * ) Notice: Subject to any disclaimer, the term of this patent is extended or adjusted under 35 U.S.C. 154(b) by 27 days.

(21) Appl. No.: 16/592,013

(22) Filed: Oct. 3, 2019

(65) Prior Publication Data
US 2021/0104512 A1    Apr. 8, 2021

(51) Int. Cl.
| | |
|---|---|
| *H01L 27/02* | (2006.01) |
| *H01L 29/06* | (2006.01) |
| *H01L 29/747* | (2006.01) |
| *H01L 29/66* | (2006.01) |

(52) U.S. Cl.
CPC ...... *H01L 27/0262* (2013.01); *H01L 29/0649* (2013.01); *H01L 29/66386* (2013.01); *H01L 29/747* (2013.01)

(58) Field of Classification Search
CPC ............. H01L 27/0262; H01L 29/0649; H01L 29/66386; H01L 29/747; H01L 27/0277
USPC .................................. 257/103, 173; 438/22
See application file for complete search history.

(56) References Cited

U.S. PATENT DOCUMENTS

| | | | |
|---|---|---|---|
| 9,059,198 B2 | 6/2015 | Di Sarro et al. | |
| 2013/0057991 A1 | 3/2013 | Chatty et al. | |
| 2015/0022921 A1* | 1/2015 | Vinson | H01L 27/0262 361/56 |
| 2020/0135714 A1* | 4/2020 | Mallikarjunaswamy | H01L 27/0255 |
| 2020/0194424 A1* | 6/2020 | Choi et al. | H01L 27/0277 |

FOREIGN PATENT DOCUMENTS

| | | |
|---|---|---|
| CN | 1457097 | 11/2003 |
| CN | 105304698 | 2/2016 |

\* cited by examiner

*Primary Examiner* — Thinh T Nguyen
(74) *Attorney, Agent, or Firm* — Anthony Canale; Andrew M. Calderon; Roberts Calderon Safran & Cole, P.C.

(57) ABSTRACT

The present disclosure relates to semiconductor structures and, more particularly, to bi-directional silicon controlled rectifiers (SCRs) and methods of manufacture. The structure includes: a plurality of diffusion regions; a plurality of p-type (P+) wells adjacent to the diffusion regions, wherein the P+ wells are directly connected; and a plurality of n-type (N+) wells adjacent to the P+ wells.

18 Claims, 11 Drawing Sheets

BI-DIRECTIONAL BREAKDOWN SILICON CONTROLLED RECTIFIERS

FIELD OF THE INVENTION

The present disclosure relates to semiconductor structures and, more particularly, to bi-directional breakdown silicon controlled rectifiers (SCRs) and methods of manufacture.

BACKGROUND

As semiconductor devices continue to scale downwards, e.g., shrink, the desired spacing between features (i.e., the pitch) also becomes smaller. To this end, in the smaller technology nodes, devices become more vulnerable to external stress. In this way, it becomes ever more difficult to fabricate devices with certain features to guarantee a robust chip due to critical dimension (CD) scaling and process capabilities, as well as materials that are used to fabricate such structures.

Fifth generation (5G) network technology implements switches within the network for switching between plus and minus (+/−) voltages. External stressors, such as electrostatic discharge (ESD), can cause issues for the switches. Accordingly, these switches require protection from ESD in order to operate properly. To address the ESD issue, conventional solutions use multiple single direction silicon controlled rectifiers (SCRs) in series together with diodes. The issue with this conventional solution is the consumption of a relatively large area, which may not be available. Further, these conventional devices do not provide symmetric protection for the (+/−) voltage windows. This is because conventional devices have the p-type (P+) wells isolated from one another, resulting in a non-uniform trigger voltage because the isolated P+ wells are at different potentials.

SUMMARY

In an aspect of the disclosure, a structure comprises: a plurality of diffusion regions; a plurality of p-type (P+) wells adjacent to the diffusion regions, wherein the P+ wells are directly connected; and a plurality of n-type (N+) wells adjacent to the P+ wells.

In an aspect of the disclosure, a structure comprises: a first P+ well directly connected to a second P+ well; a plurality of diffusion regions adjacent to the first P+ well and the second P+ well; and a first N+ well directly connected to a second N+ well and adjacent to the plurality of diffusion regions, the first N+ well adjacent to the first P+ well and the second N+ well adjacent to the second P+ well.

In an aspect of the disclosure, a structure comprises: a plurality of P+ wells directly connected to one another; a plurality of silicide blocks adjacent to the P+ wells; a plurality of diffusion regions connected to the P+ wells by the silicide blocks; a plurality of N+ wells connected to the diffusion regions by the silicide blocks; and an STI structure isolating the N+ wells from each other.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

Figure 1A:
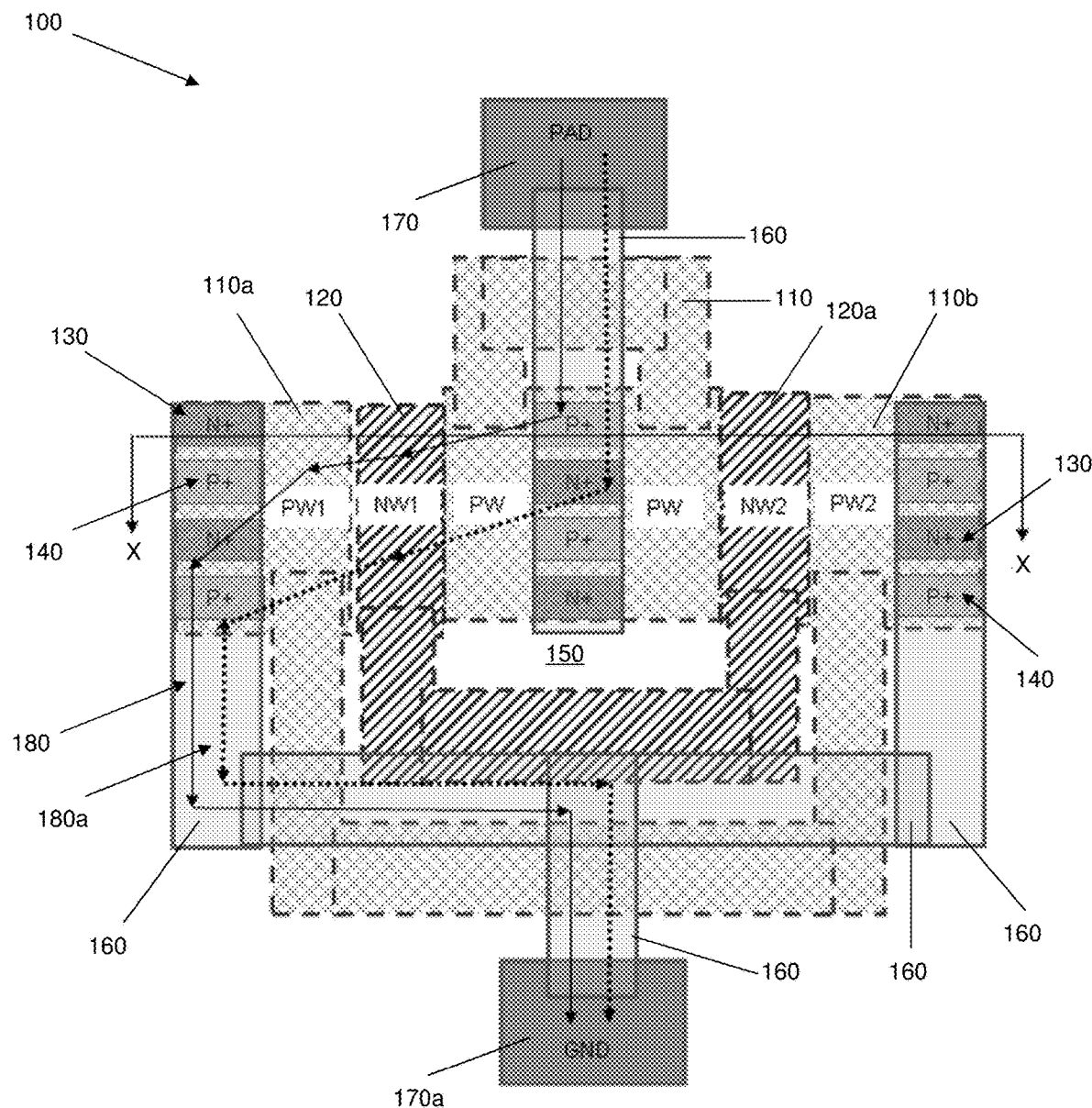
FIGS. 1A and 1B show a bi-directional breakdown silicon controlled rectifier (SCR) and respective fabrication processes in accordance with aspects of the present disclosure.

The present disclosure relates to semiconductor structures and, more particularly, to bi-directional breakdown silicon controlled rectifiers (SCRs) and methods of manufacture. In embodiments, the present disclosure provides for bi-directional breakdown SCRs for implementation within fifth generation (5G) networks, amongst other networks and circuitry. Advantageously, the structures and processes described herein improve electrostatic discharge (ESD) protection for switches implemented within the 5G networks, while minimizing the area needed for implementation. In this way, the bi-directional breakdown SCRs provide symmetric protection of plus and minus (+/−) voltage windows with minimum area needed, saving as much as 40% of the area.

The structures of the present disclosure comprise multiple p-type (P+) and n-type (N+) regions along with a plurality of P+ wells and N+ wells to form bi-directional breakdown SCRs. In embodiments, the plurality of P+ wells are in connection to one another, while the plurality of N+ wells can be connected together. Connecting the P+ wells allows for a uniform trigger voltage, thereby providing symmetric protection for the +/− voltage windows. Specifically, this allows for breakdown voltage tenability to be maintained within the 5G network, as an example. Additionally, the structures and processes described herein allow for scaling with any number of SCRs. In this way, the present disclosure offers a novel way to create multi-finger bi-directional breakdown SCRs for ESD protection for +/− voltage windows of various switches without an area penalty.

In embodiments, the plurality of P+ regions, N+ regions, P+ wells and N+ wells can be connected using silicide blocks to form a bi-directional breakdown SCR. In further embodiments, the plurality of P+ regions, N+ regions, P+ wells and N+ wells can be connected using silicide blocks and gates. In even further embodiments, the plurality of P+ regions, N+ regions, P+ wells and N+ wells can be connected using silicide blocks and a highly resistive layer, e.g., BFMOAT, or a relatively shallow implant. Regardless, of the embodiment, the plurality of P+ wells will be connected to one another to provide a uniform trigger voltage for symmetrical protection of the +/− voltage windows.

The structures of the present disclosure can be manufactured in a number of ways using a number of different tools. In general, though, the methodologies and tools are used to form structures with dimensions in the micrometer and nanometer scale. The methodologies, i.e., technologies, employed to manufacture the structures of the present disclosure have been adopted from integrated circuit (IC) technology. For example, the structures are built on wafers and are realized in films of material patterned by photolithographic processes on the top of a wafer. In particular, the fabrication of the structures use three basic building blocks: (i) deposition of thin films of material on a substrate, (ii) applying a patterned mask on top of the films by photolithographic imaging, and (iii) etching the films selectively to the mask.

Figure 1B:
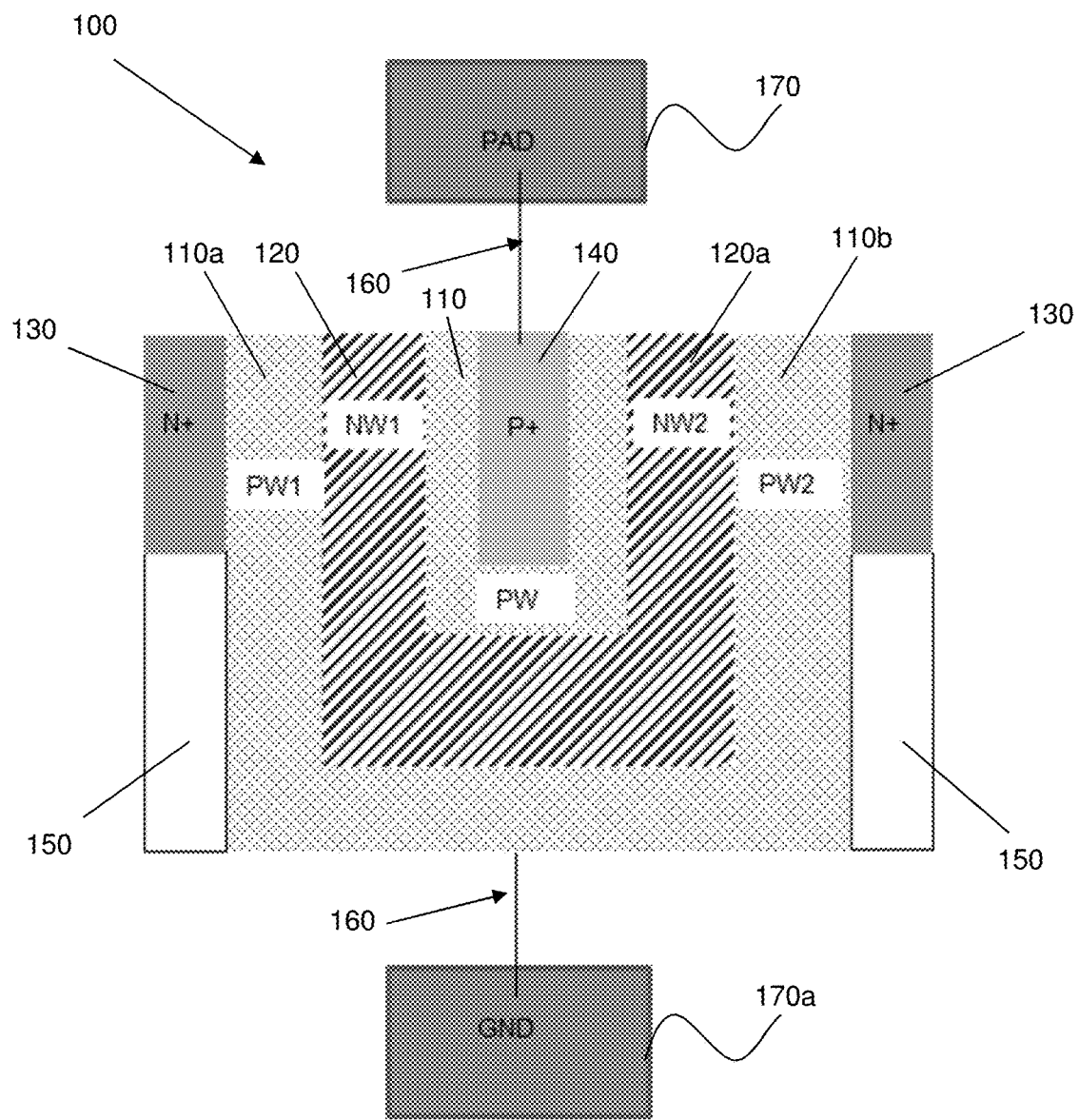

FIGS. 1A and 1B show an incoming structure 100 and respective fabrication processes in accordance with aspects of the present disclosure, with FIG. 1B illustrating a cross-sectional view along the X-X axis of FIG. 1A. The structure 100 is representative of a multi-finger bi-directional breakdown SCR. In embodiments, the structure 100 includes a common P+ well 110, a first P+ well 110a and a second P+ well 110b. The P+ wells 110, 110a, 110b are comprised of a substrate doped with a p-type species, e.g., boron, for example. The substrate may be composed of any suitable material including, but not limited to, Si, SiGe, SiGeC, SiC, GaAs, InAs, InP, etc.

The structure 100 further includes a first N+ well 120 and a second N+ well 120a. In this way, structure 100 includes a common P+ well 110 adjacent to the plurality of N+ wells 120, 120a. Specifically, the N+ wells 120, 120a are comprised of the substrate material doped with an n-type species, e.g., phosphorus, for example. In embodiments, the first P+ well 110a, the second P+ well 110b, the first N+ well 120 and the second N+ well 120a can be U-shaped, as shown in FIG. 1B. However, it is noted that other shapes are also contemplated herein.

The structure 100 further includes diffusion regions N+ region 130 and P+ region 140 adjacent to the P+ wells 110, 110a, 110b. In this way, the diffusion regions 130, 140 comprise a P+ region 140 and an N+ region 130. In embodiments, the diffusion regions N+ region 130 and P+ region 140 sit on the P+ wells 110, 110a, 110b, thereby making the P+ wells 110, 110a, 110b the sources of diffusion.

The N+ region 130 is doped with an n-type species, e.g., phosphorus, while the P+ region 140 is doped with a p-type species, e.g., boron. Accordingly, structure 100 includes a plurality of diffusion regions 130, 140, and a plurality of p-type (P+) wells 110a, 110b adjacent to the diffusion regions 130, 140, wherein the P+ wells 110a, 110b are directly connected. As shown in FIG. 1B, the P+ wells 110a, 110b are connected underneath the diffusion regions 130, 140. Structure 100 also includes a plurality of n-type (N+) wells 120, 120a adjacent to the P+ wells 110a, 110b. The plurality of N+ wells 120, 120a are directly connected.

The diffusion regions N+ region 130 and P+ region 140 are connected by metallization features 160, which connect pad 170 to ground 170a. In embodiments, the metallization features 160 are representative of diffusion connections, i.e., source and drain metallization features. The metallization features 160 can be comprised of a metal material, e.g., cobalt (Co), tungsten (W) or Ruthenium (Ru), for example.

Structure 100 is a bi-directional breakdown SCR because it provides for multiple paths. For example, path 180 occurs during the plus (+) voltage window, with the electrons traveling from the pad 170 to the P+ region 140. From the P+ region 140, the electrons will flow across the common P+ well 110, the first N+ well 120 and the first P+ well 110a because of shallow trench isolation (STI) structures 150, which further assist in providing a uniform triggering voltage, thereby providing further ESD protection. In this way, structure 100 includes a shallow trench isolation (STI) structure 150 adjacent to the plurality of P+ wells 110a, 110b and the plurality of N+ wells 120, 120a. It is also contemplated herein that STI structures 150 are not required between the P+ wells 110, 110a, 110b and the N+ wells 120, 120a. In embodiments, the P+ wells 110, 110a, 110b and the N+ wells 120, 120a may directly contact each other.

Continuing with path 180, the electrons travel to the N+ region 130. From the N+ region 130, the electrons will flow across the P+ region 140 and back across the first P+ well 110a to the ground 170a. In comparison, path 180a occurs during the negative (−) voltage window, with the electrons traveling from the pad 170 to the N+ region 130 and across the common P+ well 110, the first N+ well 120 and the first P+ well 110a. From there, the electrons travel to the P+ region 140, and then flow across the first P+ well 110a to the ground 170a. Accordingly, the structure 100 is a bi-directional breakdown SCR since it allows for paths for both the (+) voltage window and the (−) voltage window.

By providing bi-directional paths, symmetric ESD protection can be achieved during both the (+) voltage window and the (−) voltage window. Further, path 180 allows for the structure 100 to be a PNP SCR since the path begins at the P+ region 140 and travels through the N+ region 130. Alternatively, path 180a allows the structure 100 to be an NPN SCR since the path begins at the N+ region 130 and travels through the P+ region 140.

It is also contemplated herein that the paths 180, 180a can be mirrored onto the other side of the structure 100. For example, path 180 can have the electrons travel from the P+ region 140 and across the common P+ well 110, to the second N+ well 120a and the second P+ well 110b, as opposed to the to the first N+ well 120 and the first P+ well 110a, as shown in FIG. 1A. Further, the paths 180, 180a allow for the electrons to travel vertically and/or laterally, thereby offering further improved ESD protection.

Continuing with FIGS. 1A and 1B, the first P+ well 110a and the second P+ well 110b are directly connected to one another to provide a uniform triggering voltage. In comparison, traditional devices have the p-wells isolated from one another, thereby causing a non-uniform triggering voltage because the isolated p-wells are at different potentials. Accordingly, by having the first P+ well 110a and the second P+ well 110b connected to one another, the structures and processes described herein allow for a uniform potential between the first P+ well 110a and the second P+ well 110b. The uniform potential between the first P+ well 110a and the second P+ well 110b creates a uniform triggering voltage. The uniform triggering voltage provides symmetric ESD protection during the (+/−) voltage windows.

In embodiments, the first N+ well 120 and the second N+ well 120a can also be directly connected to one another, as shown in FIG. 1B. In this way, the structures and processes described herein provide for a first P+ well 110a to be directly connected to a second P+ well 110b, with a plurality of diffusion regions 130, 140 adjacent to the first P+ well 110a and the second P+ well 110b. Additionally, structure 100 includes a first N+ well 120 directly connected to a second N+ well 120a and adjacent to the plurality of diffusion regions 130, 140, with the first N+ well 120 adjacent to the first P+ well 110a and the second N+ well 120a adjacent to the second P+ well 110b.

Figure 2A:
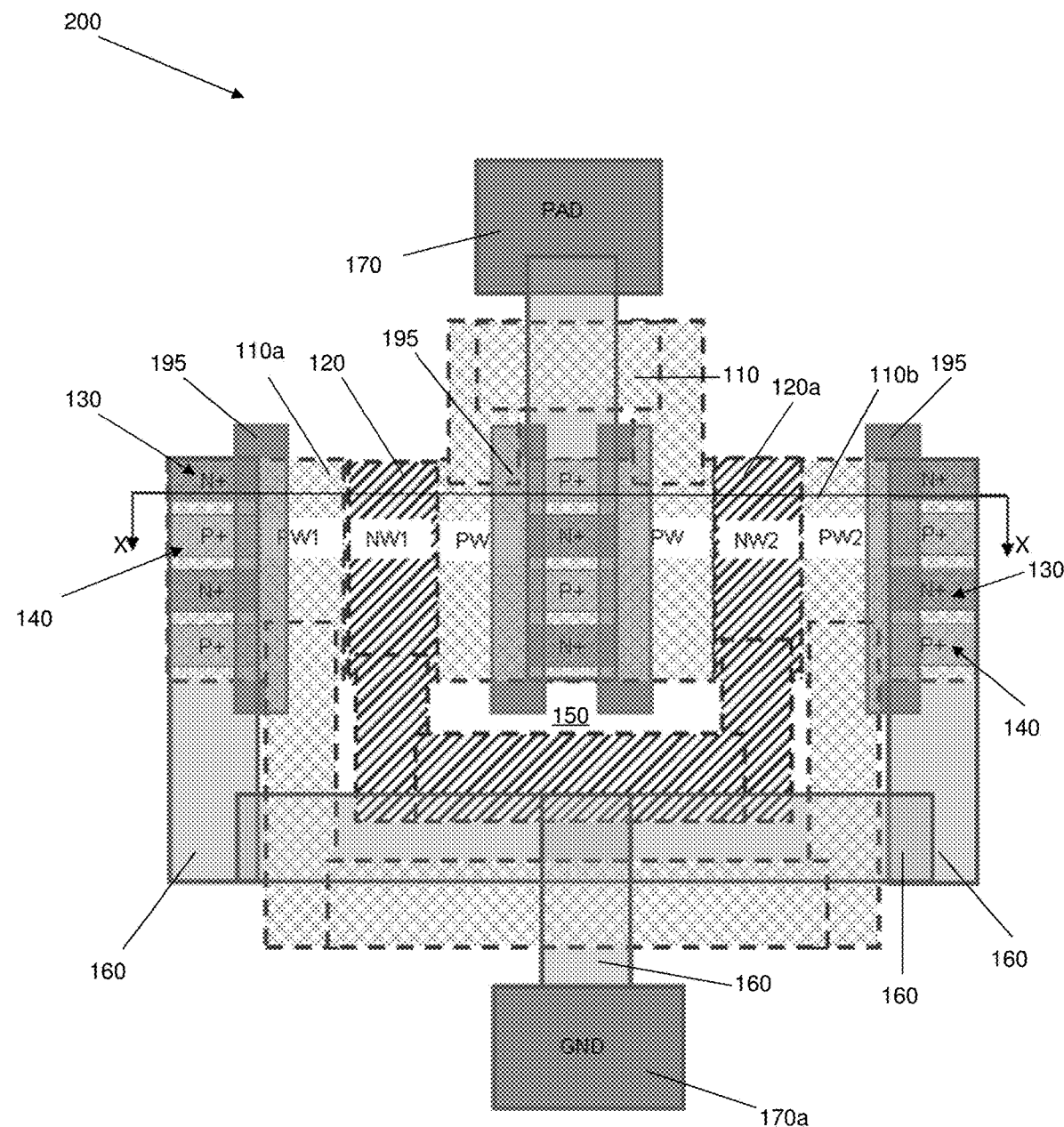
FIGS. 2A and 2B show a bi-directional breakdown SCR implementing silicide blocks and gate structures and respective fabrication processes in accordance with aspects of the present disclosure.
Figure 2B:
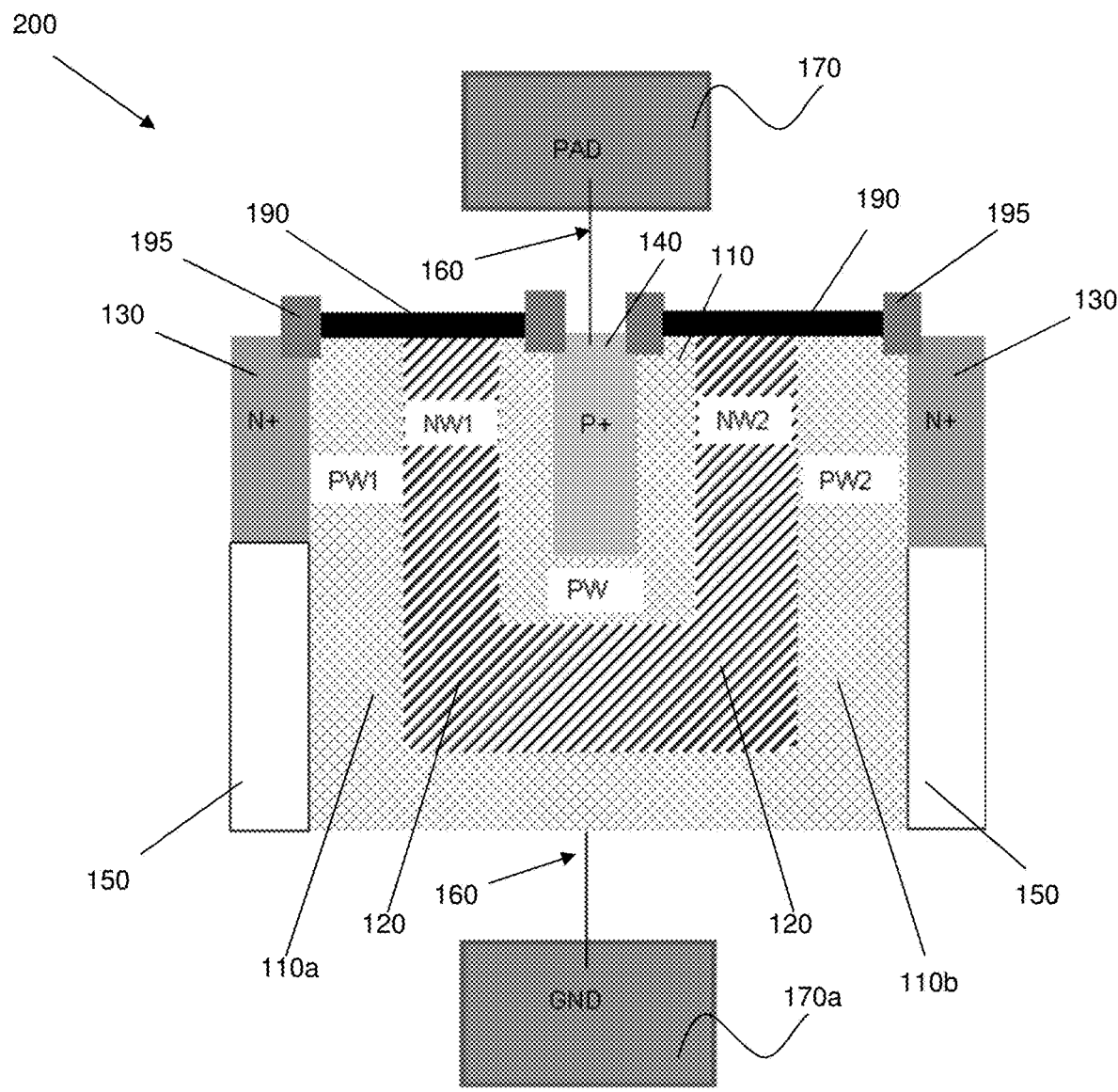

FIGS. 2A and 2B illustrate similar features of the multi-finger bi-directional breakdown SCR of FIGS. 1A and 1B, along with additional features. Specifically, FIG. 2B is a cross-sectional view along the X-X axis of FIG. 2A. In embodiments, structure 200 includes silicide blocks 190 between gate structures 195. Specifically, structure 200 includes silicide blocks 190 connecting the P+ wells 110a, 110b to the diffusion regions 130. Further, structure 200 includes silicide blocks 190 connecting the N+ wells 120, 120a to the diffusion regions 130. In this way, structure 200 includes a plurality of P+ wells 110a, 110b directly connected to one another, and a plurality of silicide blocks 190 adjacent to the P+ wells 110a, 110b. Further, structure 200 includes a plurality of diffusion regions 130, 140 connected to the P+ wells 110a, 110b by the silicide blocks 190, and a plurality of N+ wells 120, 120a connected to the diffusion regions 130, 140 by the silicide blocks 190. Additionally, structure 200 includes an STI structure 150 isolating the N+ wells 120, 120a from each other.

The placement of silicide blocks over the P+ wells 110a, 110b and N+ wells 120, 120a, can cause leakage because of the interface between the P+ wells 110a, 110b and the silicide block 190 and also at the interface between the N+ wells 120, 120a and the silicide block 190. To address this leakage, gate structures 195 comprising a poly-Si material are positioned at various junctions of structure 200 to control and/or reduce the leakage. Specifically, gate structures 195 are placed at the junctions between the N+ region 130 and the P+ wells 110a, 110b. Further, the gate structures 195 are also positioned at the junctions between the common P+ well 110 and the P+ region 140. In this way, structure 200 includes a plurality of gate structures 195 at junctions between the common P+ well 110 and the P+ region 140 and at junctions between the diffusion regions 130, 140 and the plurality of P+ wells 110a, 110b.

Structure 200 includes silicide blocks 190 between the gate structures 195. In embodiments, the silicide blocks 190 are over the common P+ well 110 and the N+ wells 120, 120a. Accordingly, leakage can be controlled and/or reduced by the poly-Si of the gate structures 195, thereby further increasing ESD protection. It is also contemplated herein that the gate structures 195 can be placed at all junctions, i.e., junctions between the P+ wells 110, 110a, 110b and N+ wells 120, 120a.

Figure 3A:
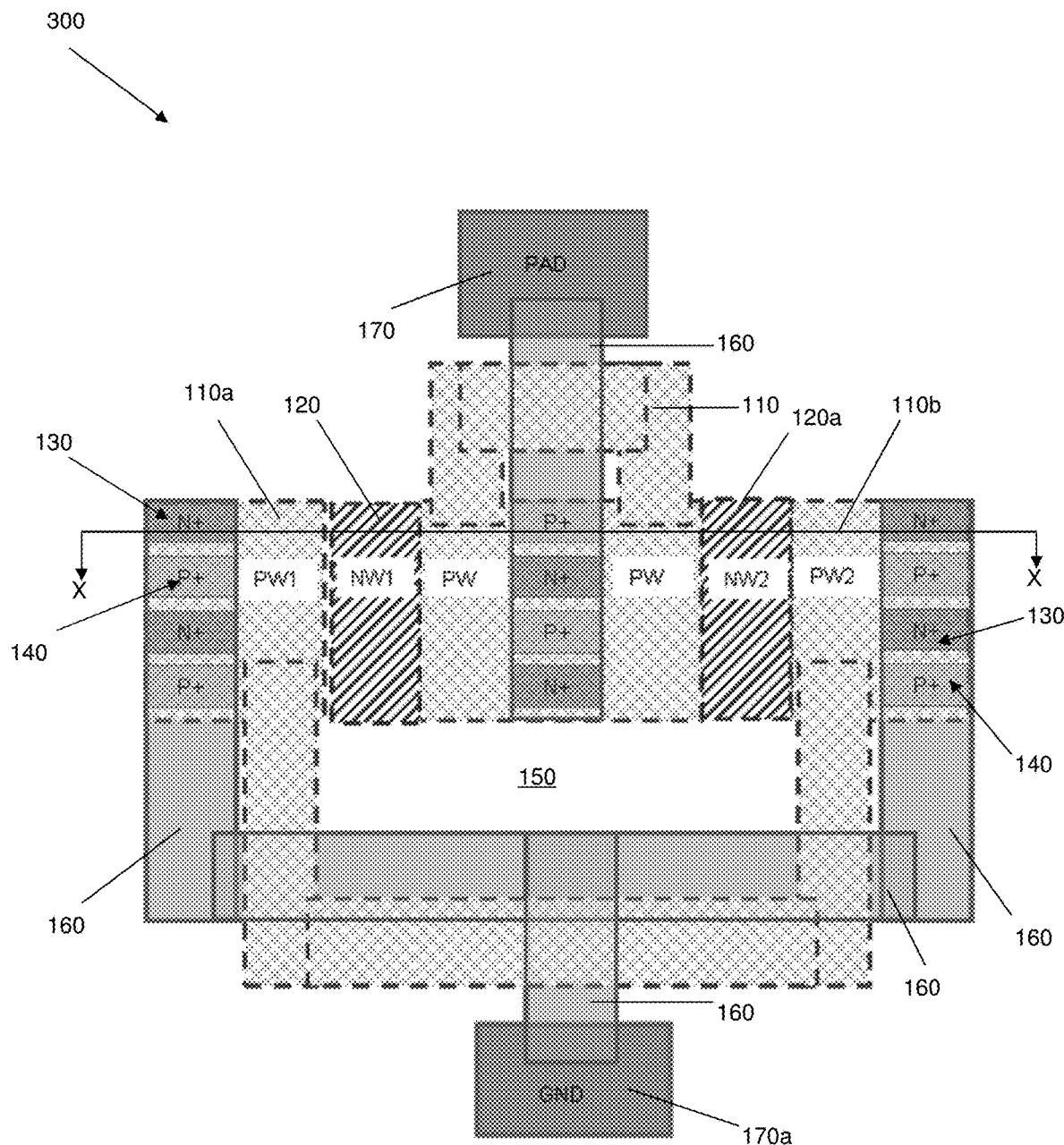
FIGS. 3A and 3B show a bi-directional breakdown SCR with isolated n-type (N+) wells and respective fabrication processes in accordance with aspects of the present disclosure.
Figure 3B:
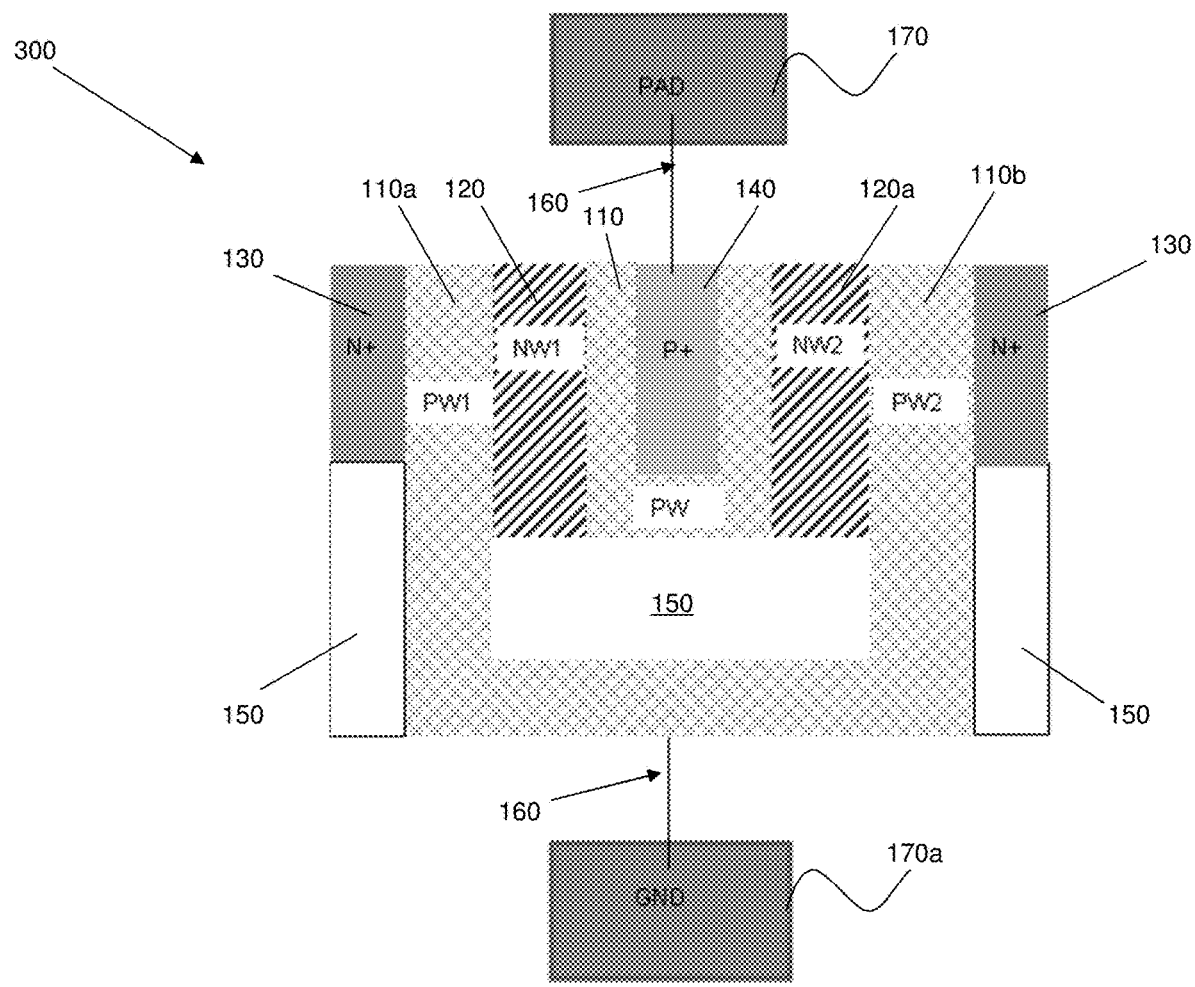

FIGS. 3A and 3B illustrate similar features of the multi-finger bi-directional breakdown SCR of FIGS. 1A and 1B, along with additional features. Specifically, FIG. 3B is a cross-sectional view along the X-X axis of FIG. 3A. In embodiments, structure 300 includes a STI structure 150, which isolate the first N+ well 120 from second N+ well 120a. In this way, the plurality of N+ wells 120, 120a are isolated from each other by the STI structure 150. This allows for structure 300 to save an additional area compared to structure 100. Accordingly, structure 300 further increases a reduction in area compared to conventional devices, i.e., greater than a 40% area saving.

As shown in FIGS. 3A and 3B, the first P+ well 110a and the second P+ well 110b remain connected to one another, regardless of the isolation of the N+ wells 120, 120a. Specifically, the connections between the P+ wells 110a, 110b are desired because they are the main diffusion regions since the N+ regions 130 and the P+ regions 140 sit on the P+ wells 110, 110a, 110b. In this way, the connected P+ wells 110a, 110b remain at the same potential, which causes a uniform triggering voltage.

Figure 4A:
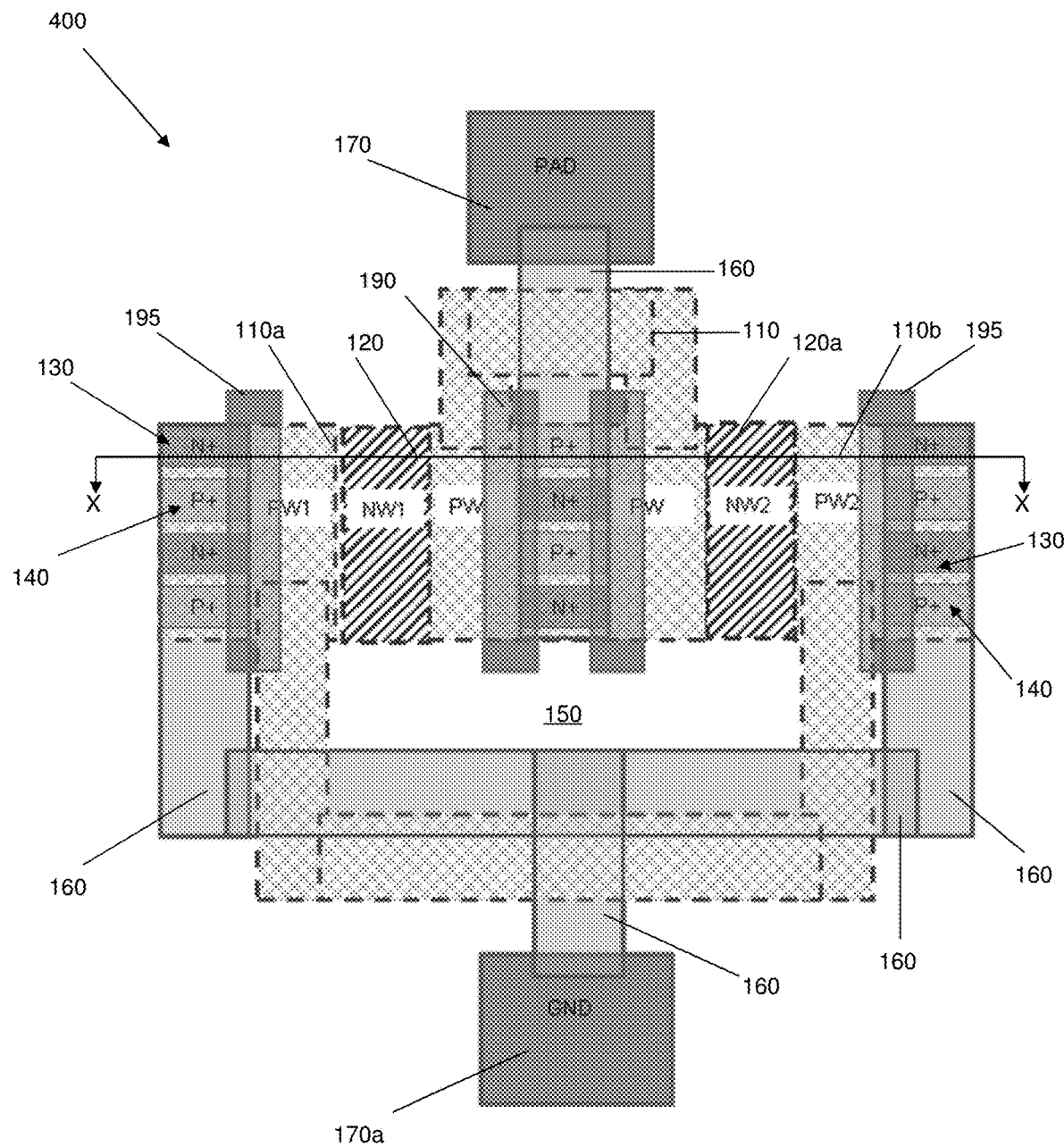
FIGS. 4A and 4B show a bi-directional breakdown SCR implementing silicide blocks and gate structures and respective fabrication processes in accordance with aspects of the present disclosure.
Figure 4B:
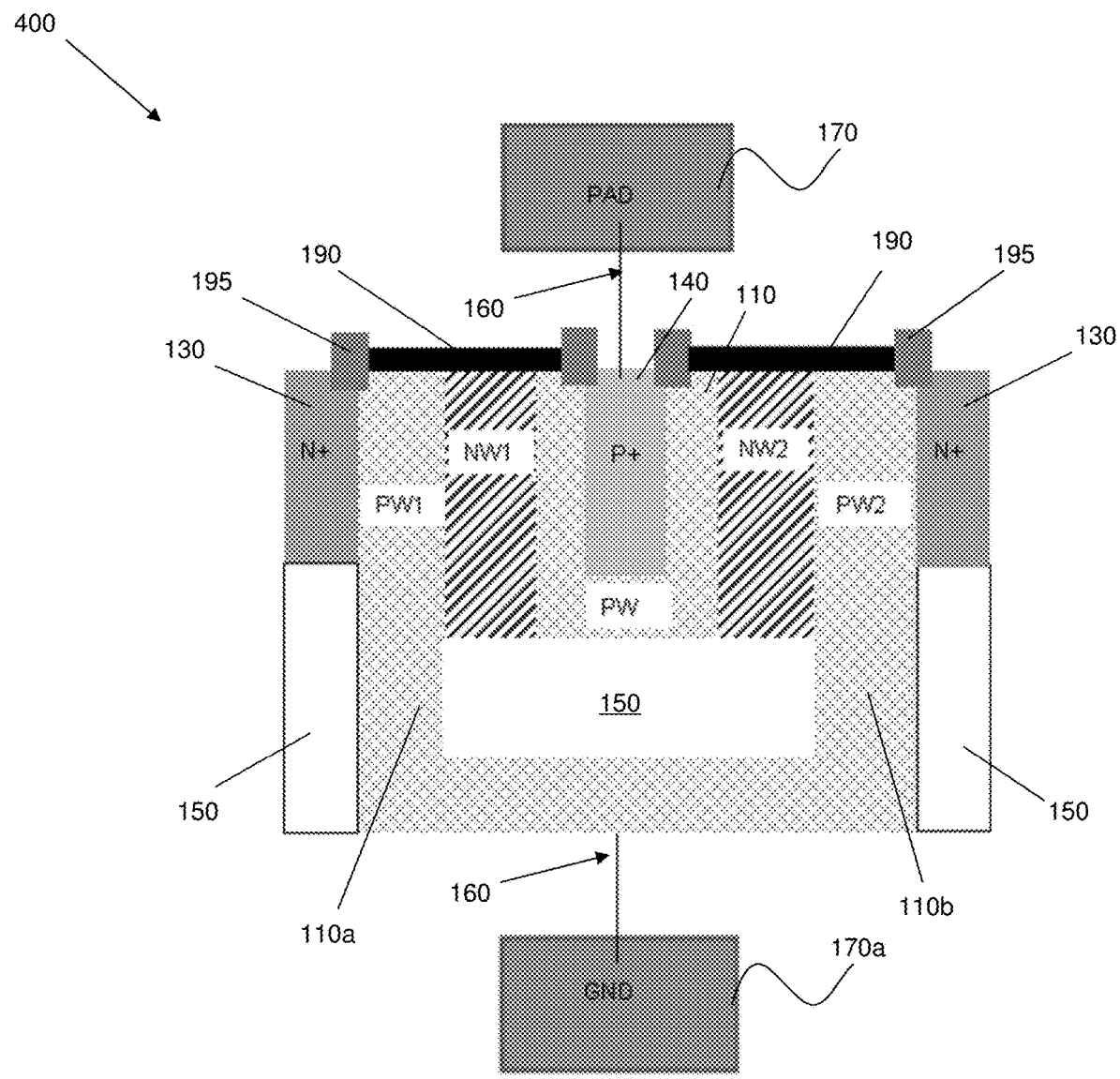

FIGS. 4A and 4B illustrate similar features of the multi-finger bi-directional breakdown SCR of FIGS. 2A and 2B, along with additional features. Specifically, FIG. 4B is a cross-sectional view along the X-X axis of FIG. 4A. Similar to structure 200 of FIGS. 2A and 2B, structure 400 includes silicide blocks 190 between gate structures 195. By placing the gate structures 195 comprised of poly-Si at junctions between the N+ region 130 and the P+ wells 110a, 110b, and at the junctions between the common P+ well 110 and the P+ region 140, leakage can be controlled and/or reduced. Accordingly, ESD protection is further increased by having controlled and/or reduced leakage.

Figure 5:
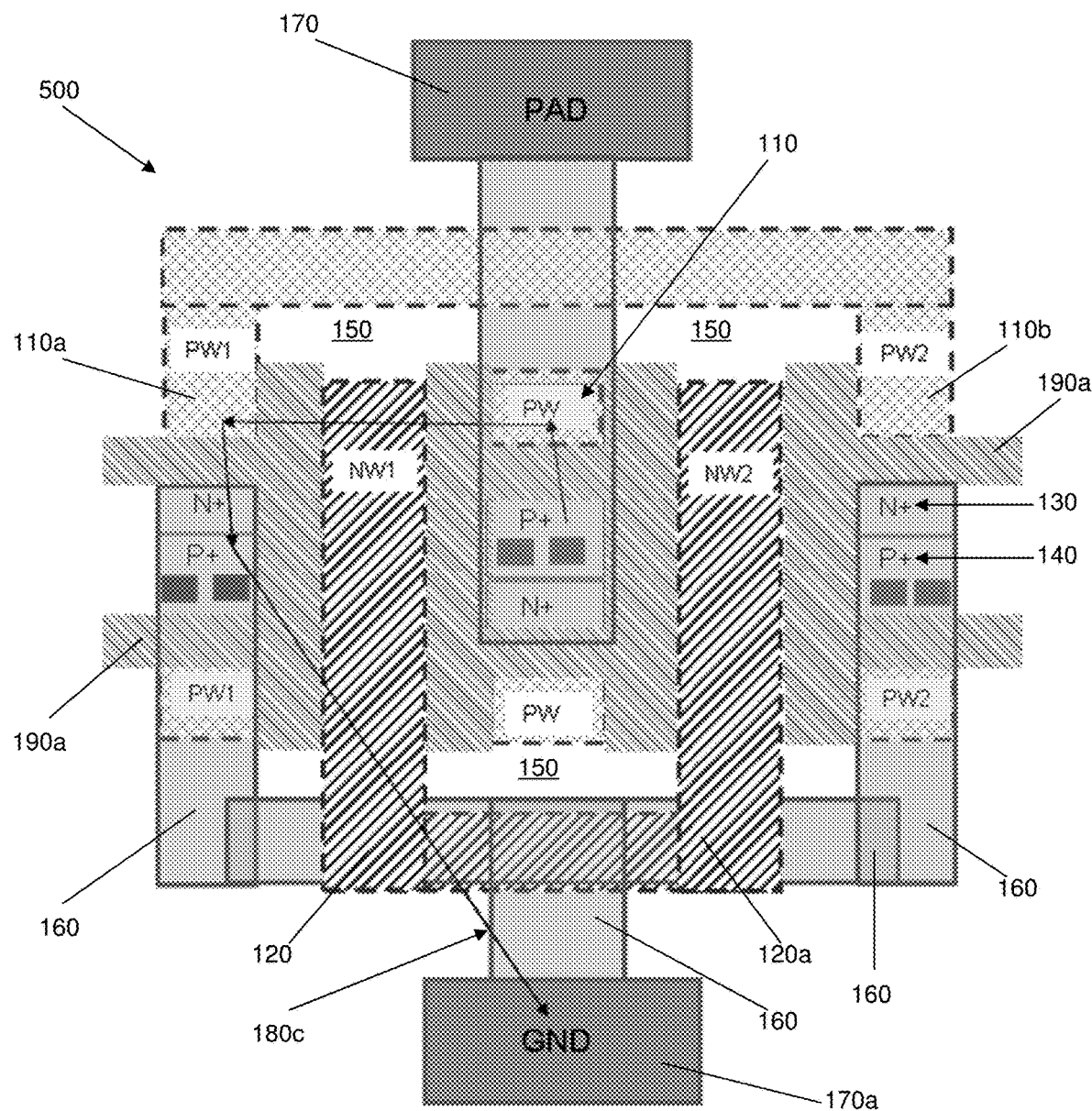
FIG. 5 shows an alternative bi-directional breakdown SCR and respective fabrication processes in accordance with aspects of the present disclosure.

FIG. 5 illustrates a multi-finger bi-directional breakdown SCR in accordance with the present disclosure. The structure 500 of FIG. 5 is similar to the features of the multi-finger bi-directional breakdown SCR of FIGS. 1A and 1B, with additional features for a further reduction in the area being consumed by the bi-directional breakdown SCR. Specifically, silicide blocks 190a are implemented on top of the P+ wells 110, 110a, 110b and the N+ wells 120, 120a to create a wrap-around structure with the silicide blocks 190a wrapping around the structure 500.

As shown in FIG. 5, the connection between the P+ wells 110a, 110b occurs over the diffusion regions N+ region 130 and the P+ region 140. In comparison, the connection between the P+ wells 110a, 110b of FIGS. 1A-4B occurs outside of the diffusion regions N+ region 130 and the P+ region 140. Additionally, the silicide blocks 190a allow for a junction to be created between the diffusion regions N+ region 130 and the P+ region 140 and the P+ wells 110, 110a, 110b.

The connection between the P+ wells 110a, 110b being underneath the diffusion regions N+ region 130 and the P+ region 140, in addition to the junctions created by the silicide blocks 190a, allow for the area of the common P+ well 110 to be reduced. Specifically, the area of the common P+ well 110 of structure 500 is greatly reduced compared to the common P+ well 110 illustrated in FIGS. 1A-4B. In this way, structure 500 is a more compact bi-directional breakdown SCR.

Path 180c occurs during the (+) voltage window and allows the electrons to flow from the P+ region 140, through the silicide block 190a to the common P+ well 110, across the silicide block 190a to the first N+ well 120. The path 180c then travels across the silicide block 190a to the first P+ well 110a. From there, the path travels across the silicide block 190a to the diffusion regions N+ region 130 and the P+ region 140. From there, the path 180c travels back across the silicide block 190a to the first N+ well 120 to ground 170a. Alternatively, for the (−) voltage window, a path would begin at the N+ region 130.

Figure 6:
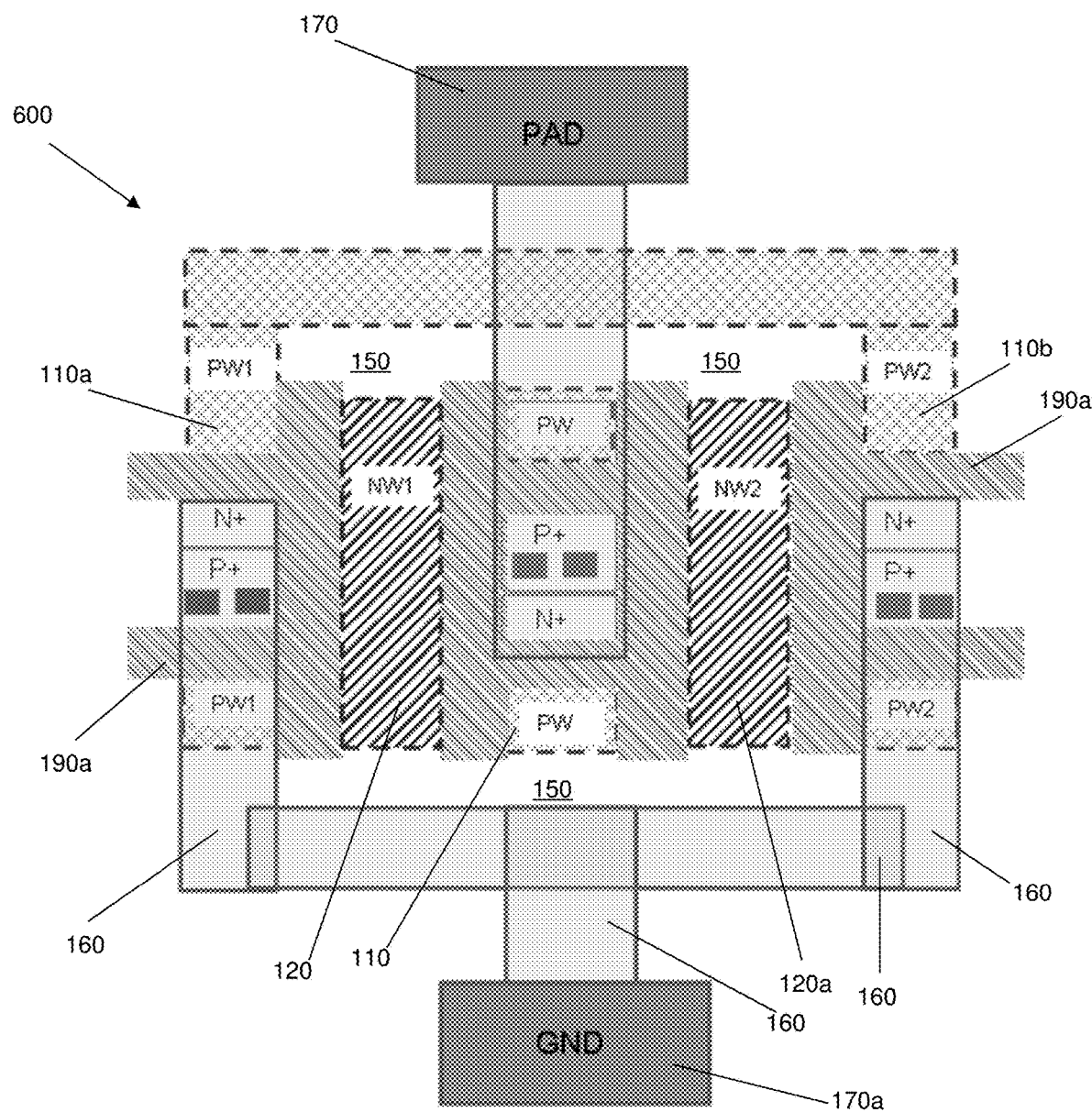
FIG. 6 shows a bi-directional breakdown SCR with isolated N+ wells and respective fabrication processes in accordance with aspects of the present disclosure.

FIG. 6 illustrates similar features of the multi-finger bi-directional breakdown SCR of FIG. 5, along with additional features. Specifically, structure 600 includes a larger STI structure 150, to isolate the first N+ well 120 and the second N+ well 120a from one another. This allows for further area to be saved compared to structure 500, thereby further increasing the reduction in area compared to conventional devices, i.e., greater than a 40% saving of area.

Figure 7:
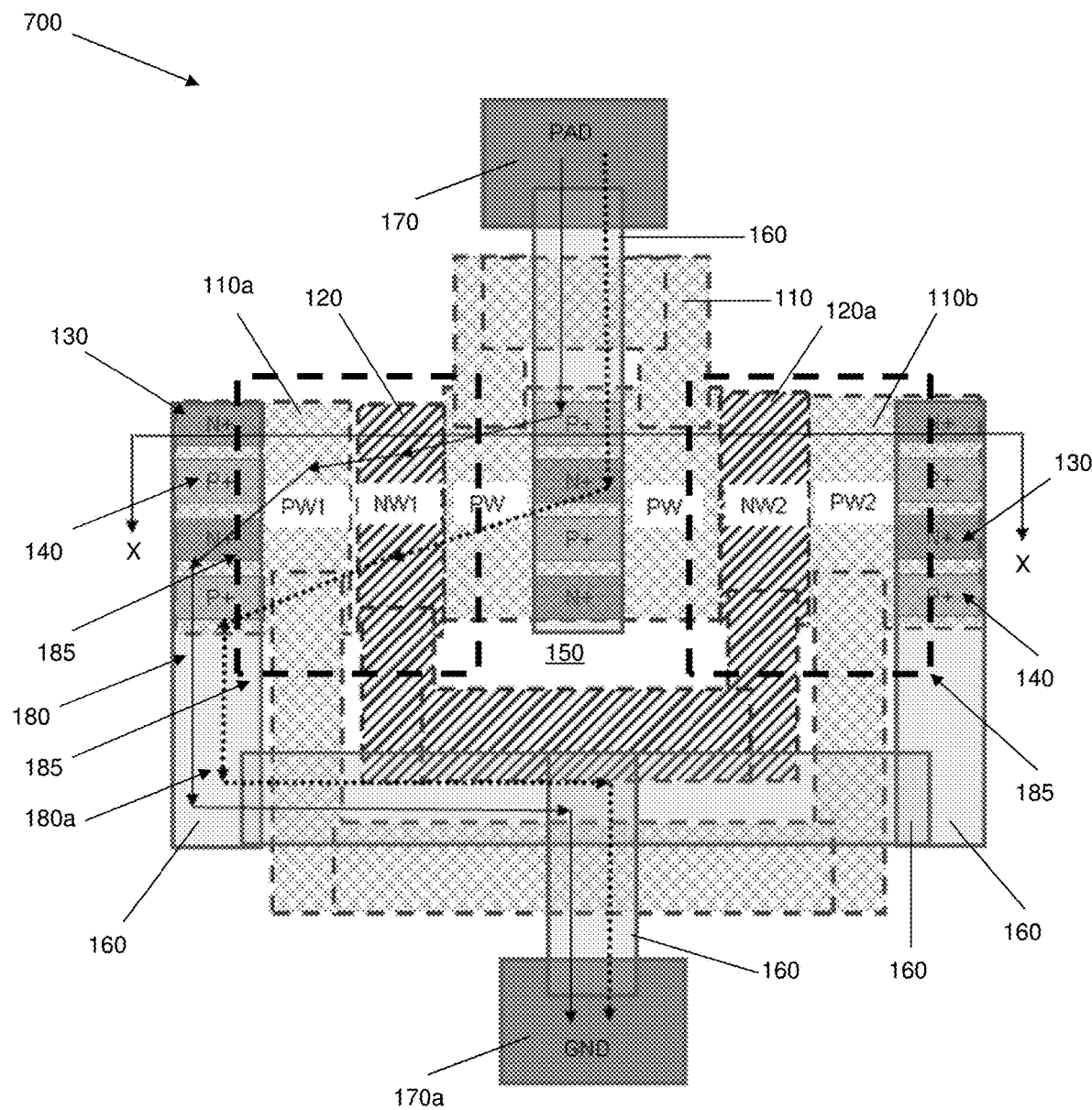
FIG. 7 shows a bi-directional breakdown SCR with isolated N+ wells and a highly resistive layer and respective fabrication processes in accordance with aspects of the present disclosure.

FIG. 7 illustrates a multi-finger bi-directional breakdown SCR in accordance with the present disclosure. Specifically, structure 700 implements a highly resistive layer 185 to isolate the N+ wells 120, 120a from one another. In embodiments, the highly resistive layer 185 (represented as the dashed box) is over the P+ wells 110, 110a, 110b, the N+ wells 120, 120a and the N+ regions 130 and P+ regions 140. In embodiments, the highly resistive layer 185 can be, e.g., a moat region of $BF_2^+$ (BFMOAT) or a relatively shallow implant. The remaining features are similar to structure 100 of FIGS. 1A and 1B.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure, comprising:
    a plurality of diffusion regions;
    a plurality of p-type (P+) wells adjacent to the diffusion regions, wherein the P+ wells are directly connected;
    a plurality of n-type (N+) wells adjacent to the P+ wells; and
    silicide blocks connecting the P+ wells to the diffusion regions.

2. The structure of claim 1, wherein the plurality of N+ wells are directly connected.

3. The structure of claim 1, further comprising a shallow trench isolation (STI) structure adjacent to the plurality of P+ wells and the plurality of N+ wells.

4. The structure of claim 3, wherein the plurality of N+ wells are isolated from each other by the STI structure.

5. The structure of claim 1, further comprising a plurality of gate structures at junctions between the diffusion regions and the plurality of P+ wells.

6. The structure of claim 5, wherein the silicide blocks are between the gate structures.

7. The structure of claim 1, further comprising a common P+ well adjacent to the plurality of N+ wells.

8. The structure of claim 7, wherein the diffusion regions comprise a P+ region and an N+ region.

9. The structure of claim 8, further comprising gate structures at junctions between the common P+ well and the P+ region.

10. The structure of claim 9, wherein the silicide blocks are between the gate structures.

11. The structure of claim 10, wherein the silicide blocks are over the common P+ well and the N+ wells.

12. The structure of claim 1, wherein the silicide blocks connect the N+ wells to the diffusion regions.

13. The structure of claim 1, wherein the P+ wells are connected underneath the diffusion regions.

14. The structure of claim 1, wherein the P+ wells are connected over the diffusion regions.

15. A structure, comprising:
    a first P+ well directly connected to a second P+ well;
    a plurality of diffusion regions adjacent to the first P+ well and the second P+ well;
    a first N+ well directly connected to a second N+ well and adjacent to the plurality of diffusion regions, the first N+ well adjacent to the first P+ well and the second N+ well adjacent to the second P+ well; and
    a plurality of silicide blocks connecting the first N+ well and the second N+ well.

16. The structure of claim 15, wherein the plurality of silicide blocks connect the first P+ well and the second P+ well.

17. The structure of claim 15, wherein the plurality of silicide blocks connect the diffusion regions to first N+ well and the second N+ well.

18. A structure, comprising:
    a plurality of P+ wells directly connected to one another;
    a plurality of silicide blocks adjacent to the P+ wells;
    a plurality of diffusion regions connected to the P+ wells by the silicide blocks;
    a plurality of N+ wells connected to the diffusion regions by the silicide blocks; and
    an STI structure isolating the N+ wells from each other.

* * * * *